United States Patent
Puvvada et al.

(10) Patent No.: US 9,222,981 B2
(45) Date of Patent: Dec. 29, 2015

(54) GLOBAL LOW POWER CAPTURE SCHEME FOR CORES

(71) Applicant: NVIDIA Corporation, Santa Clara, CA (US)

(72) Inventors: Satya Puvvada, San Jose, CA (US);
Milind Sonawane, San Jose, CA (US);
Amit D Sanghani, San Jose, CA (US);
Anubhav Sinha, Hyderabad (IN);
Vishal Agarwal, Sunnyvale, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 13/730,690

(22) Filed: Dec. 28, 2012

(65) Prior Publication Data
US 2014/0189454 A1    Jul. 3, 2014

(51) Int. Cl.
*G01R 31/28*    (2006.01)
*G01R 31/3185*  (2006.01)

(52) U.S. Cl.
CPC  *G01R 31/318544* (2013.01); *G01R 31/318575* (2013.01)

(58) Field of Classification Search
CPC ............... G01R 31/318547; G01R 31/318575; G01R 31/31727; G01R 31/318544; G06F 17/50; G06F 17/505; G06F 2217/14; G06F 13/1689; G06F 9/445
USPC .................................. 714/731, 729; 716/136
See application file for complete search history.

(56) References Cited

U.S. PATENT DOCUMENTS

| | | | |
|---|---|---|---|
| 3,577,086 A | 5/1971 | Kliman et al. |
| 5,453,993 A | 9/1995 | Kitaguchi et al. |
| 5,805,611 A | 9/1998 | McClure |
| 5,881,271 A | 3/1999 | Williams |
| 6,489,819 B1 | 12/2002 | Kono et al. |
| 6,653,957 B1 | 11/2003 | Patterson et al. |
| 6,817,006 B1 | 11/2004 | Wells et al. |

(Continued)

FOREIGN PATENT DOCUMENTS

TW    594023    6/2004
TW    200811455    3/2008

(Continued)

OTHER PUBLICATIONS

Amit Sanghani, Power Droop Reduction Via Clock-Gating for At-Speed Scan Testing, U.S. Appl. No. 13/444,780, filed Apr. 11, 2012.

(Continued)

*Primary Examiner* — David Ton

(57) ABSTRACT

A method for testing an integrated circuit to reduce peak power problems during scan capture mode is presented. The method comprises programming a respective duration of a first time window for each of a plurality of cores and a cache on the integrated circuit. It further comprises counting the number of pulses of a first clock signal during the first time window for each of the plurality of cores and the cache. Subsequently, the method comprises staggering capture pulses to the plurality of cores and the cache by generating pulses of a second clock signal for each of the plurality of cores and the cache during a respective second time window, wherein the number of pulses generated is based on the respective number of first clock signal pulses counted for each of the plurality of cores and the cache.

20 Claims, 9 Drawing Sheets

STAGGER MODE1

(56) References Cited

U.S. PATENT DOCUMENTS

| | | |
|---|---|---|
| 6,874,107 B2 | 3/2005 | Lesea |
| 6,877,123 B2 | 4/2005 | Johnston et al. |
| 6,891,395 B2 | 5/2005 | Wells et al. |
| 6,904,375 B1 | 6/2005 | Sabih et al. |
| 7,100,066 B2 | 8/2006 | Jeong |
| 7,210,082 B1 | 4/2007 | Abdel-Hafez et al. |
| 7,249,298 B2 | 7/2007 | Sim |
| 7,275,195 B2 | 9/2007 | Martinez |
| 7,305,598 B1 | 12/2007 | Sanghani et al. |
| 7,383,481 B2 | 6/2008 | Warren et al. |
| 7,562,276 B1 | 7/2009 | Azimi et al. |
| 7,624,322 B2 | 11/2009 | Duggal et al. |
| 7,657,807 B1 | 2/2010 | Watkins et al. |
| 7,739,568 B1 | 6/2010 | Bertanzetti |
| 7,788,588 B2 | 8/2010 | McKee et al. |
| 7,849,348 B1 | 12/2010 | Sidiropoulos et al. |
| 7,925,465 B2 | 4/2011 | Lin et al. |
| 7,937,634 B2 | 5/2011 | Almukhaizim et al. |
| 7,949,916 B1 | 5/2011 | Ang |
| 8,205,125 B2 | 6/2012 | Hales et al. |
| 8,214,704 B1 | 7/2012 | Bertanzetti |
| 8,301,947 B1 | 10/2012 | Makar et al. |
| 8,407,544 B2 * | 3/2013 | Majumdar et al. ............ 714/731 |
| 8,432,768 B2 | 4/2013 | Ware et al. |
| 8,438,437 B2 | 5/2013 | Jain et al. |
| 8,458,543 B2 | 6/2013 | Tung |
| 8,464,117 B2 * | 6/2013 | Rakheja et al. ............... 714/731 |
| 8,483,437 B2 * | 7/2013 | Shamaie ....................... 382/103 |
| 8,522,096 B2 | 8/2013 | Wang et al. |
| 8,522,190 B1 | 8/2013 | Sanghani et al. |
| 8,543,873 B2 | 9/2013 | Sul |
| 8,650,524 B1 * | 2/2014 | Chakravadhanula et al. 716/114 |
| 8,726,112 B2 | 5/2014 | Rajski et al. |
| 8,904,256 B1 | 12/2014 | Chakravadhanula et al. |
| 2002/0184560 A1 | 12/2002 | Wang et al. |
| 2008/0195346 A1 | 8/2008 | Lin et al. |
| 2010/0313089 A1 | 12/2010 | Rajski et al. |
| 2011/0166818 A1 | 7/2011 | Lin et al. |
| 2011/0296265 A1 * | 12/2011 | Rakheja et al. ............... 714/731 |
| 2012/0110402 A1 | 5/2012 | Wang et al. |
| 2012/0331362 A1 * | 12/2012 | Tekumalla .................... 714/731 |
| 2013/0271197 A1 | 10/2013 | Sanghani et al. |
| 2013/0318414 A1 * | 11/2013 | Sinanoglu .................... 714/729 |
| 2014/0129885 A1 | 5/2014 | Chen et al. |

FOREIGN PATENT DOCUMENTS

| | | |
|---|---|---|
| TW | 201239377 | 10/2012 |
| WO | 2011059439 | 5/2011 |

OTHER PUBLICATIONS

Amit Sanghani, Power Droop Reduction Via Clock-Gating for At-Speed Scan Testing, U.S. Appl. No. 13/444,782, filed Apr. 11, 2012.

* cited by examiner

STAGGER MODE1

STAGGER MODE2

STAGGER MODE3

STAGGER MODE0
(no stagger mode)

Arcs show masks required in various stagger modes for ATPG.

GLOBAL LOW POWER CAPTURE SCHEME FOR CORES

CROSS-REFERENCE TO RELATED APPLICATIONS

Related Applications

The present application is related to U.S. Pat. No. 7,305,598, filed Mar. 25, 2005, entitled "TEST CLOCK GENERATION FOR HIGHER-SPEED TESTING OF A SEMICONDUCTOR DEVICE," naming Amit Sanghani and Philip Manela as inventors. That application is incorporated herein by reference in its entirety and for all purposes.

The present application is also related to the following co-pending U.S. patent applications: U.S. patent application Ser. No. 13,730,551, filed Dec. 28, 2012, entitled "SYSTEM FOR REDUCING PEAK POWER DURING SCAN SHIFT AT THE LOCAL LEVEL FOR SCAN BASED TESTS," naming Milind Sonawane, Satya Puvvada and Amit Sanghani as inventors, which is incorporated herein by reference in its entirety and for all purposes, U.S. patent application Ser. No. 13,730,628, filed Dec. 28, 2012, , entitled "SYSTEM FOR REDUCING PEAK POWER DURING SCAN SHIFT AT THE GLOBAL LEVEL FOR SCAN BASED TESTS," naming Milind Sonawane, Satya Puvvada and Amit Sanghani as inventors, which is also incorporated herein by reference in its entirety and for all purposes.

FIELD OF THE INVENTION

Embodiments according to the present invention generally relate to testing integrated circuits and more specifically to performing scan based tests on integrated circuits.

BACKGROUND OF THE INVENTION

An integrated circuit or circuit assembly generally contains one or more clocks, either generated internally or controlled externally. Each clock is distributed to a set of storage cells via a skew-minimized network, which delivers a clock pulse to all the storage cells at virtually the same time. Such a clock, its related storage cells and all combinational logic blocks bounded by the storage cells, form a clock domain.

Scan testing of circuits is well known and is the most widely used design-for-test (DFT) technique used to test integrated circuits. It replaces all or part of original storage cells with scan cells that may be linked to form one or more scan chains. A scan-based integrated circuit or circuit assembly can be tested by repeating a shift cycle followed by a capture cycle. In a shift cycle, pseudorandom or predetermined test stimuli are shifted into all scan chains, making their outputs as controllable as primary inputs. In a capture cycle, test responses are latched into some or all scan chains, making their inputs as observable as primary outputs, because the values captured into scan chains can be shifted out in the next shift cycle.

Scan based tests are expensive because of the high capital investment in test equipment and because they can require a considerable amount of time to run. Test times for scan based tests depend on how fast the test is being run and the volume of the test, e.g., the magnitude of the test pattern. Due to high demands to reduce test costs of scan based tests and optimize turn-around time for integrated circuit releases, scan operations need to be run at increasingly higher clock speeds.

Running scan operations at higher clock speeds helps in reducing the overall test time. However, it can cause power issues resulting in flip-flops and gates behaving incorrectly under inadequate power supply conditions. This could cause false failures due to the electrical and thermal stressing of the silicon under test, which could result in significant yield loss. Accordingly, users of the test system are left with no other alternative but to slow down the clock speeds in order to minimize power related issues, which results in longer test times.

Further, the dynamic power consumption during scan test, with and without test compression, is always higher than the functional mode because of very high toggling rates and logic activity during scan shift and scan capture operations and can result in excessive heat dissipation during testing that can damage the package. This increased dynamic power consumption can cause reliability issues in chips, which may result in the chip subsequently failing in the field. This is because during scan test mode, power dissipation will exceed the peak power for which the chip and package has been designed.

Certain conventional systems have attempted to address power reduction during scan capture cycles, but they are either costly in terms of computation time or require significant implementation and verification efforts. For example, certain techniques have been developed in the industry to perform low power ATPG pattern generation where, based on a predetermined toggle estimate, pattern generation tools will enable clock gating cells for certain regions of the integrated circuit while disabling others. However, this technique requires considerable memory and CPU resources.

Further, low power capture X-filling methods in ATPG have also been developed to reduce the number of transitions at the output of scan flip-flops in capture mode. However, these methods also are problematic because they lead to lower defect coverage than random-fill.

Additionally, other conventional systems implement low power capture logic such that based on a given target, the ATPG tool can be enabled to capture clock activity in selective regions of the integrated circuit. An example of the technique is disclosed in U.S. patent application Ser. Nos. 13/444,780 and 13/444,782, both entitled "Power Droop Reduction Via Clock-Gating For At-Speed Scan Testing" and naming Amit Sanghani and Bo Yang as inventors. This technique is efficient because it prevents the ATPG tool from performing too many computations, and it is faster in terms of run time, however, significant implementation and verification efforts are required to implement it and there is considerable logic overhead.

BRIEF SUMMARY OF THE INVENTION

Accordingly, a need exists for a system that allows scan capture operations to run at the high clock speeds while reducing peak power during at-speed (e.g., at application speed) capture cycles without any coverage impact and minimal test-time impact. It is also necessary to make the scan test mode power-aware to avoid stressing the power distribution network in test mode during production testing. Embodiments of the present invention provide a method and system for reducing peak power problems during scan capture mode that are computationally efficient and provide high defect coverage.

According to one embodiment of the present invention, staggering the capture clock to CPU cores and the cache, e.g., an L2C cache, is used to reduce higher than acceptable peak power magnitudes during scan capture cycles, thereby, allowing at-speed testing during scan capture, which in turn reduces the overall test time during production test.

In one embodiment, a method for testing an integrated circuit is presented. The method comprises programming a respective duration of a first time window for each of a plurality of cores and a cache on the integrated circuit. It further comprises counting the number of pulses of a first clock signal during the first time window for each of the plurality of cores and the cache. Subsequently, the method comprises staggering capture pulses to the plurality of cores and the cache by generating pulses of a second clock signal for each of the plurality of cores and the cache during a respective second time window, wherein the number of pulses generated is based on the respective number of first clock signal pulses counted for each of the plurality of cores and the cache.

In another embodiment, a method for testing an integrated circuit is presented. The method comprises programming a respective duration of a first time window for each of a plurality of modules on the integrated circuit, wherein the modules comprise cores and a cache. Further, the method comprises counting a number of pulses of a first clock signal during the first time window for each of the plurality of modules. Finally the method comprises dynamically staggering capture pulses to a first subset of modules by generating pulses of a second clock signal for each of the plurality of cores and the cache during a respective second time window, wherein a number of pulses generated is based on the respective number of first clock signal pulses counted for each of the plurality of modules.

In a different embodiment, a system for testing an integrated circuit is presented. The system comprises a computer system comprising a tester processor, wherein the tester processor is communicatively coupled to a integrated circuit. Further, the integrated circuit comprises a plurality of cores and a cache, an I/O port operable to program a respective duration of a first time window for each of the plurality of cores and the cache on the integrated circuit, and a plurality of fast clock generating modules. The fast clock generating modules are configured to count the number of pulses of a first clock signal during the first time window for each of the plurality of cores and the cache. The fast clock modules are further configured to stagger capture pulses to the plurality of cores and the cache by generating pulses of a second clock signal for each of the plurality of cores and the cache during a respective second time window, wherein the number of pulses generated is based on the respective number of first clock signal pulses counted for each of the plurality of cores and the cache.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

DETAILED DESCRIPTION OF THE INVENTION

Figure 1:
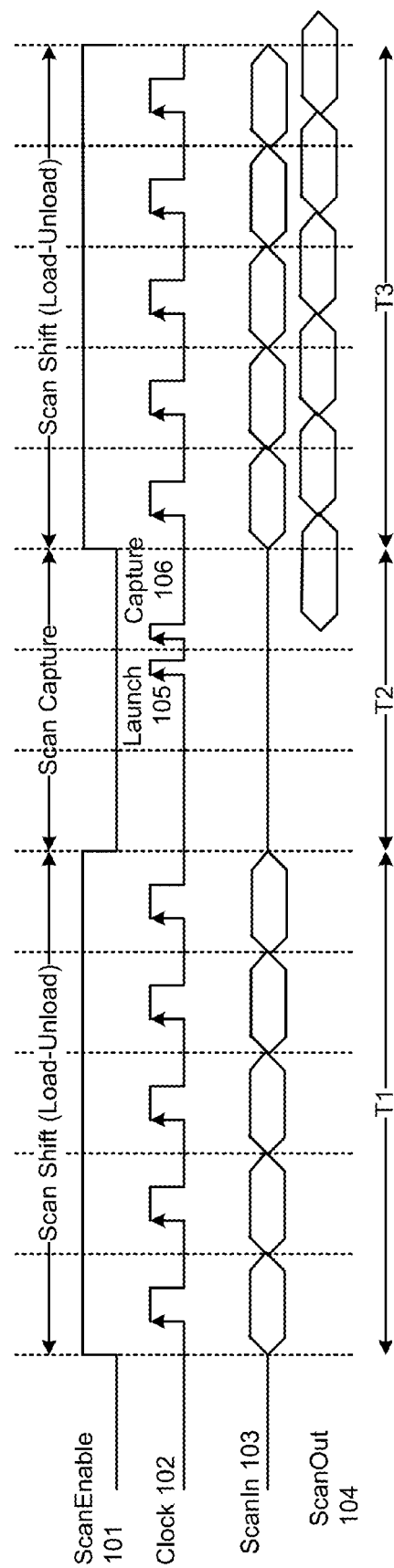
FIG. 1 is a timing diagram of an exemplary scan shift and scan capture cycle of a conventional scan based test.

Reference will now be made in detail to the various embodiments of the present disclosure, examples of which are illustrated in the accompanying drawings. While described in conjunction with these embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Some portions of the detailed descriptions that follow are presented in terms of procedures, logic blocks, processing, and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those utilizing physical manipulations of physical quantities. Usually, although not necessarily, these quantities take the form of electrical or magnetic signals capable of being stored, transferred, combined, compared, and otherwise manipulated in a computer system. It has proven convenient at times, principally for reasons of common usage, to refer to these signals as transactions, bits, values, elements, symbols, characters, samples, pixels, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present disclosure, discussions utilizing terms such as "programming," "counting," "staggering," "routing," "generating," "shifting," "allocating," "associating," "moving," "accessing," "determining," "identifying," "caching," "maintaining," "incrementing," or the like, refer to actions and processes (e.g., flowchart 900 of FIG. 9) of a computer system or similar electronic computing device or processor (e.g., system 110 of FIG. 3A). The computer system or similar electronic computing device manipulates and transforms data represented as physical (electronic) quantities within the computer system memories, registers or other such information storage, transmission or display devices.

Embodiments described herein may be discussed in the general context of computer-executable instructions residing on some form of computer-readable storage medium, such as program modules, executed by one or more computers or other devices. By way of example, and not limitation, computer-readable storage media may comprise non-transitory computer-readable storage media and communication media; non-transitory computer-readable media include all computer-readable media except for a transitory, propagating signal. Generally, program modules include routines, programs, objects, components, data structures, etc., that perform particular tasks or implement particular abstract data types. The functionality of the program modules may be combined or distributed as desired in various embodiments.

Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information and that can be accessed to retrieve that information.

Communication media can embody computer-executable instructions, data structures, and program modules, and includes any information delivery media. By way of example, and not limitation, communication media includes wired media such as a wired network or direct-wired connection, and wireless media such as acoustic, radio frequency (RF), infrared, and other wireless media. Combinations of any of the above can also be included within the scope of computer-readable media.

Figure 3A:
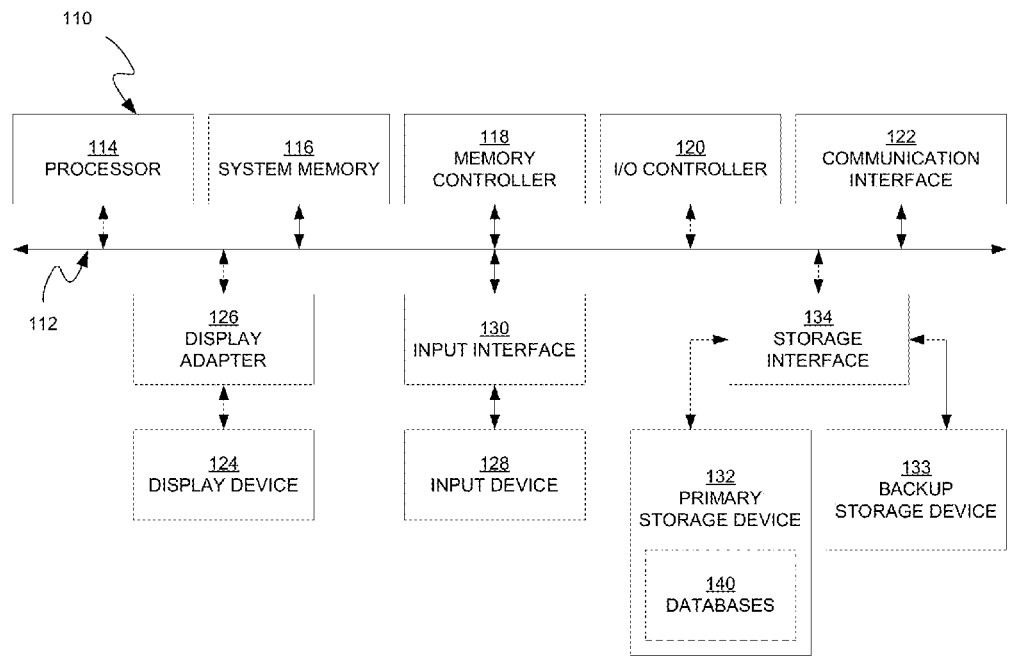
FIG. 3A is a block diagram of an example of a computing system capable of implementing embodiments of the present invention.

FIG. 3A is a block diagram of an example of a tester computing system 110 capable of implementing embodiments of the present disclosure. Computing system 110 broadly represents any single or multi-processor computing device or system capable of executing computer-readable instructions. Examples of computing system 110 include, without limitation, workstations, laptops, client-side terminals, servers, distributed computing systems, handheld devices, or any other computing system or device. In its most basic configuration, computing system 110 may include at least one processor 114 and a system memory 116.

Tester processor 114 generally represents any type or form of processing unit capable of processing data or interpreting and executing instructions. In certain embodiments, processor 114 may receive instructions from a software application or module. These instructions may cause processor 114 to perform the functions of one or more of the example embodiments described and/or illustrated herein.

System memory 116 generally represents any type or form of volatile or non-volatile storage device or medium capable of storing data and/or other computer-readable instructions. Examples of system memory 116 include, without limitation, RAM, ROM, flash memory, or any other suitable memory device. Although not required, in certain embodiments computing system 110 may include both a volatile memory unit (such as, for example, system memory 116) and a non-volatile storage device (such as, for example, primary storage device 132).

Computing system 110 may also include one or more components or elements in addition to processor 114 and system memory 116. For example, in the embodiment of FIG. 3A, computing system 110 includes a memory controller 118, an input/output (I/O) controller 120, and a communication interface 122, each of which may be interconnected via a communication infrastructure 112. Communication infrastructure 112 generally represents any type or form of infrastructure capable of facilitating communication between one or more components of a computing device. Examples of communication infrastructure 112 include, without limitation, a communication bus (such as an Industry Standard Architecture (ISA), Peripheral Component Interconnect (PCI), PCI Express (PCIe), or similar bus) and a network.

Memory controller 118 generally represents any type or form of device capable of handling memory or data or controlling communication between one or more components of computing system 110. For example, memory controller 118 may control communication between processor 114, system memory 116, and I/O controller 120 via communication infrastructure 112.

I/O controller 120 generally represents any type or form of module capable of coordinating and/or controlling the input and output functions of a computing device. For example, I/O controller 120 may control or facilitate transfer of data between one or more elements of computing system 110, such as processor 114, system memory 116, communication interface 122, display adapter 126, input interface 130, and storage interface 134.

Communication interface 122 broadly represents any type or form of communication device or adapter capable of facilitating communication between example computing system 110 and one or more additional devices. For example, communication interface 122 may facilitate communication between computing system 110 and a private or public network including additional computing systems. Examples of communication interface 122 include, without limitation, a wired network interface (such as a network interface card), a wireless network interface (such as a wireless network interface card), a modem, and any other suitable interface. In one embodiment, communication interface 122 provides a direct connection to a remote server via a direct link to a network, such as the Internet. Communication interface 122 may also indirectly provide such a connection through any other suitable connection.

Communication interface 122 may also represent a host adapter configured to facilitate communication between computing system 110 and one or more additional network or storage devices via an external bus or communications channel. Examples of host adapters include, without limitation, Small Computer System Interface (SCSI) host adapters, Universal Serial Bus (USB) host adapters, IEEE (Institute of Electrical and Electronics Engineers) 1394 host adapters, Serial Advanced Technology Attachment (SATA) and External SATA (eSATA) host adapters, Advanced Technology Attachment (ATA) and Parallel ATA (PATA) host adapters, Fibre Channel interface adapters, Ethernet adapters, or the like. Communication interface 122 may also allow computing system 110 to engage in distributed or remote computing. For example, communication interface 122 may receive instructions from a remote device or send instructions to a remote device for execution.

As illustrated in FIG. 3A, computing system 110 may also include at least one display device 124 coupled to communication infrastructure 112 via a display adapter 126. Display device 124 generally represents any type or form of device capable of visually displaying information forwarded by display adapter 126. Similarly, display adapter 126 generally represents any type or form of device configured to forward graphics, text, and other data for display on display device 124.

As illustrated in FIG. 3A, computing system 110 may also include at least one input device 128 coupled to communication infrastructure 112 via an input interface 130. Input device 128 generally represents any type or form of input device capable of providing input, either computer- or human-generated, to computing system 110. Examples of input device 128 include, without limitation, a keyboard, a pointing device, a speech recognition device, or any other input device.

As illustrated in FIG. 3A, computing system 110 may also include a primary storage device 132 and a backup storage device 133 coupled to communication infrastructure 112 via a storage interface 134. Storage devices 132 and 133 generally represent any type or form of storage device or medium capable of storing data and/or other computer-readable instructions. For example, storage devices 132 and 133 may be a magnetic disk drive (e.g., a so-called hard drive), a floppy disk drive, a magnetic tape drive, an optical disk drive, a flash drive, or the like. Storage interface 134 generally represents any type or form of interface or device for transferring data between storage devices 132 and 133 and other components of computing system 110.

In one example, databases 140 may be stored in primary storage device 132. Databases 140 may represent portions of a single database or computing device or it may represent multiple databases or computing devices. For example, databases 140 may represent (be stored on) a portion of computing system 110 and/or portions of example network architecture 200 in FIG. 2 (below). Alternatively, databases 140 may represent (be stored on) one or more physically separate devices capable of being accessed by a computing device, such as computing system 110 and/or portions of network architecture 200.

Continuing with reference to FIG. 3A, storage devices 132 and 133 may be configured to read from and/or write to a removable storage unit configured to store computer software, data, or other computer-readable information. Examples of suitable removable storage units include, without limitation, a floppy disk, a magnetic tape, an optical disk, a flash memory device, or the like. Storage devices 132 and 133 may also include other similar structures or devices for allowing computer software, data, or other computer-readable instructions to be loaded into computing system 110. For example, storage devices 132 and 133 may be configured to read and write software, data, or other computer-readable information. Storage devices 132 and 133 may also be a part of computing system 110 or may be separate devices accessed through other interface systems.

Many other devices or subsystems may be connected to computing system 110. Conversely, all of the components and devices illustrated in FIG. 3A need not be present to practice the embodiments described herein. The devices and subsystems referenced above may also be interconnected in different ways from that shown in FIG. 3A. Computing system 110 may also employ any number of software, firmware, and/or hardware configurations. For example, the example embodiments disclosed herein may be encoded as a computer program (also referred to as computer software, software applications, computer-readable instructions, or computer control logic) on a computer-readable medium.

The computer-readable medium containing the computer program may be loaded into computing system 110. All or a portion of the computer program stored on the computer-readable medium may then be stored in system memory 116 and/or various portions of storage devices 132 and 133. When executed by processor 114, a computer program loaded into computing system 110 may cause processor 114 to perform and/or be a means for performing the functions of the example embodiments described and/or illustrated herein. Additionally or alternatively, the example embodiments described and/or illustrated herein may be implemented in firmware and/or hardware.

For example, a computer program for running scan based tests in accordance with embodiments of the present invention may be stored on the computer-readable medium and then stored in system memory 116 and/or various portions of storage devices 132 and 133. When executed by the processor 114, the computer program may cause the processor 114 to perform and/or be a means for performing the functions required for carrying out the scan based test processes of the present invention.

Figure 3B:
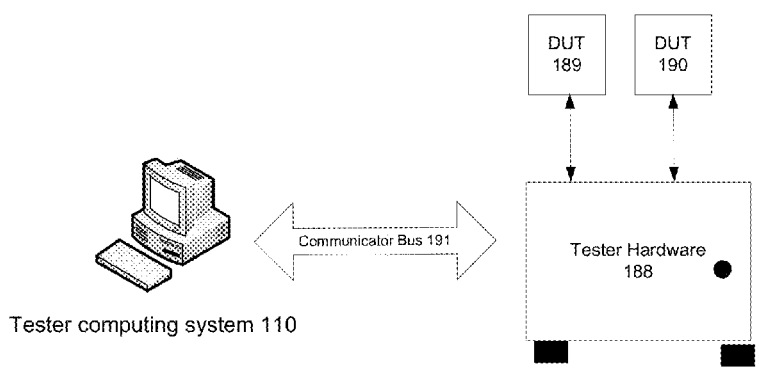
FIG. 3B is a schematic block diagram for an automated test equipment apparatus on which embodiments of the present invention can be implemented in accordance with one embodiment of the present invention.

FIG. 3B is a schematic block diagram for an automated test equipment (ATE) apparatus on which embodiments of the present scan-based test system can be implemented in accordance with one embodiment of the present invention. In one embodiment, the tester computing system 110 of FIG. 3B performs the same function as the computing system 110 discussed in reference to FIG. 3A and comprises one or more linked computers. In other embodiments, the tester computing system often comprises only a single computer. The tester computing system 110 is the overall system control unit, comprising tester processor 114, that runs the software for the ATE responsible for conducting the tests on the connected devices under test, e.g., integrated circuits being scan tested.

The communicator bus 191 provides a high-speed electronic communication channel between the tester computing system and the tester hardware. The communicator bus can also be referred to as a backplane, a module connection enabler, or system bus. Physically, communicator bus 191 is a fast, high-bandwidth duplex connection bus that can be electrical, optical, etc.

Tester hardware 188 comprises the complex set of electronic and electrical parts and connectors necessary to provide the test stimulus to the devices under test (DUTs) 189 and 190 and measure the response of the DUTs to the stimulus, and compare it against the expected response. In one embodiment of the present invention, the DUTs can be a plurality of integrated circuits being scan tested.

Global Low Power Capture Scheme for Cores

Embodiments of the present invention provide a method and system for reducing peak power problems during scan capture mode at the global level. According to one embodiment of the present invention, peak power at the global level during scan capture is reduced by staggering capture clocks to the cores and the cache, e.g., an L2C cache using dynamic Fast Test Mode (FTM) engines. This allows at-speed capture without any coverage impact and minimal test time impact.

FIG. 1 is a timing diagram of an exemplary scan shift and scan capture cycle of a conventional scan-based test. The scan-based technique is a cost-effective solution to test the operation of integrated circuits, which include functional logic elements and register elements, such as flip-flop circuits or latches, with functional interconnections between the different elements. The integrated circuit design includes specific provision for re-configuring the interconnections of the elements of the integrated circuit so that test data signals entered serially at one or more input pins can be shifted ('scanned') along a scan chain different from the normal functional system path from one register element to another in order to place the signals of the test vector at the desired positions. This takes place during time period T1 in FIG. 1, which is the scan-shift cycle. The ScanEnable signal 101 is enabled and set high during this time while the inputs represented by the ScanIn signal vector 103 are scanned in by pulsing the Clock signal 102.

The integrated circuit then returns temporarily to its normal functional system configuration for one or more clock pulses to produce test outputs corresponding to a particular logic function outcome from the normal logic functions in the integrated circuit, given the values of the test vector. These outputs are captured during the Scan Capture cycle, T2. During scan capture mode, scan flops will capture the response of combinational logic in preparation to shift that capture response using scan unload. Two pulses, Launch 105 and Capture 106, may be pulsed to produce the test outputs of the particular logic function at the output of the flip-flops and latches in the integrated circuit.

The integrated circuit then reverts to the scan shift configuration during T3 and shifts out the test outputs, as represented by signal vector ScanOut 104 in FIG. 1, along the scan chain to one or more output pins where they can be retrieved and compared with the expected results to diagnose faults.

Running scan shift operations at higher clock speeds helps in reducing the overall test time. However, it can cause power issues as a result of all the flip-flops and latches in the integrated circuit switching at the same time. For scan based tests, test power is mainly divided in scan chain shift power and scan capture power. During scan shift mode, shift clocks are applied to load scan data and unload scan data through scan chains. Average shift power will dominate heat dissipation during scan shift due to high toggling rates and logic activity as compared to functional mode. Also excessive peak power can cause scan chain failures due to voltage drop with respect to the power rails, and result in yield loss as mentioned earlier.

Figure 2:
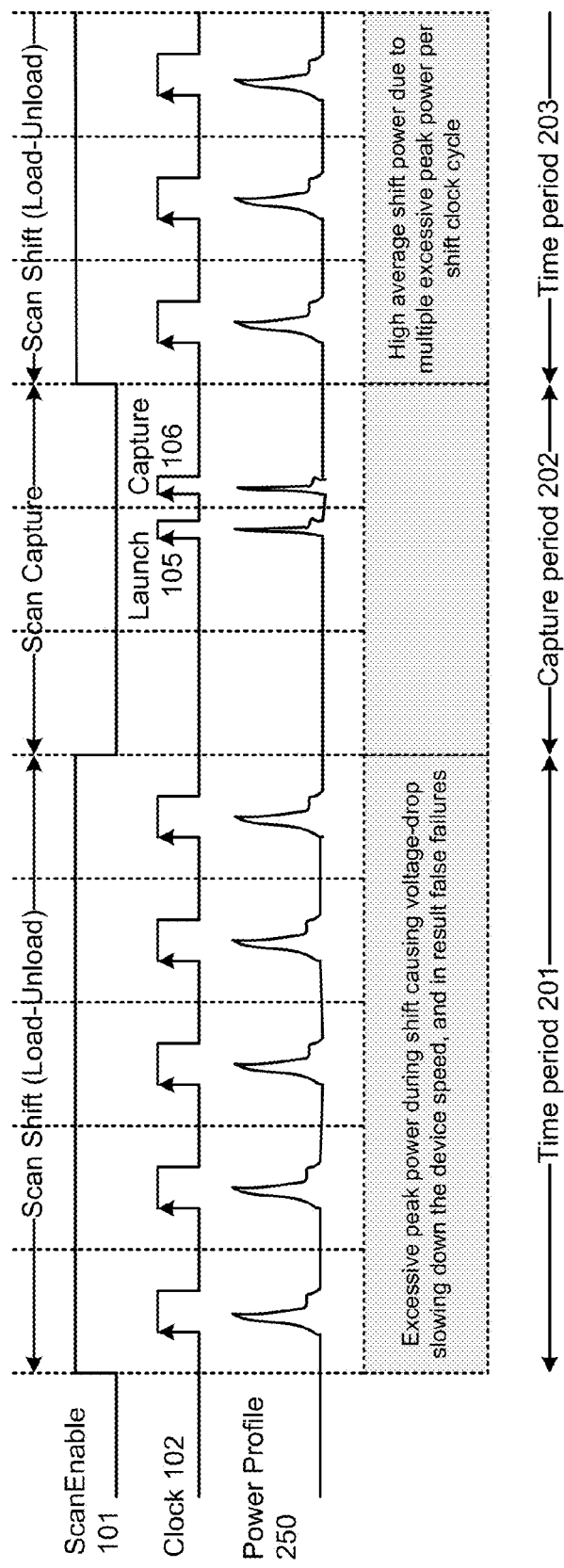
FIG. 2 is a timing diagram of the power activity during an exemplary scan shift and scan capture cycle of a conventional scan based test.

FIG. 2 is a timing diagram of the power activity during an exemplary scan shift and scan capture cycle of a conventional scan based test. Peak power during scan shift depends on the number of flip-flops clocked at the same time on the active edge of the scan clock 255. As seen from the representation of the power profile, 250, in FIG. 2, the toggling of all the flip-flops together during the scan shift cycles in time period 201 and 203 results in excessive peak power conditions. This results in a higher than desirable voltage drop from the power rails, which slows down the device speed and can cause false failures. Also it results in a high average shift power due to multiple excessive power spikes per shift clock cycle. Reducing the number of flip-flops toggled per active edge of the shift clock 255 can effectively reduce the peak power.

Certain related co-pending applications disclose techniques for addressing peak power issues during scan shift at the local and global levels for scan based tests. U.S. patent application Ser. No. 13,730,551, filed Dec. 28, 2012, entitled "SYSTEM FOR REDUCING PEAK POWER DURING SCAN SHIFT AT THE LOCAL LEVEL FOR SCAN BASED TESTS," naming Milind Sonawane, Satya Puvvada and Amit Sanghani as inventors, discloses a system for reducing peak power during scan shift at the local level. Further, U.S. patent application Ser. No. 13,730,628, filed Dec. 28, 2012, entitled "SYSTEM FOR REDUCING PEAK POWER DURING SCAN SHIFT AT THE GLOBAL LEVEL FOR SCAN BASED TESTS," naming Milind Sonawane, Satya Puvvada and Amit Sanghani as inventors, discloses techniques for reducing peak power issues at the global level.

The two co-pending applications discussed above, however, do not address the issue of mitigating peak power issues during the scan capture cycle. As seen from the power profile 250 during capture period 202 in FIG. 2, peak power issues during scan capture are equally problematic as during scan shift mode.

In one embodiment, the present invention is directed towards mitigating at application speed (or "at-speed") capture power issues. In order to detect at-speed timing fault using Automatic Test Pattern Generation (ATPG) test, capture clocks need to be pulsed at functional clock speed.

The high speed of functional clocks, however, is a concern during capture cycles because of the high switching rates associated with capturing responses from the combinational logic in the clock domains and shifting them to the scan chains as can be seen from the peaks on power profile 250 in FIG. 2 during capture period 202. The high number of transitions for a given clock edge during capture cycles can be much higher than functional mode which can cause higher instantaneous current draw during scan. The higher current in turn causes large voltage drops (or IR drops) causing larger power drops in the power grid. These higher than normal power drops in the grid cause cell delay to be increased, which can cause functioning components to fail if clock period or voltage is not increased accordingly, thus, resulting in yield loss. This failure mechanism is more prominent during at-speed testing as it is much more sensitive to path delays than regular stuck-at testing.

Further, the IR drop can result in a phenomenon known as clock stretching (widening the clock period) that can lead to false pass on the automated test equipment (ATE) and could cause test escapes. Additionally, the excessive IR drop can result in the logic gates and sequential cells not behaving correctly under inadequate power (or VDD) conditions, which can cause false failures resulting in yield loss.

Accordingly, the present invention addresses scan capture power issues by staggering capture clocks to the cores, e.g., CPU or GPU cores, and the cache on the integrated circuit, e.g., an L2C cache. Prior to the present invention, all CPU cores and the cache on the integrated circuit under test would be pulsed during scan capture at the same time, thereby, causing peak power problems. In order to accomplish the staggering, in one embodiment, the present invention leverages the dynamic Fast Test Mode (FTM) engine disclosed in U.S. Pat. No. 7,305,598, filed Mar. 25, 2005, entitled "TEST CLOCK GENERATION FOR HIGHER-SPEED TESTING OF A SEMICONDUCTOR DEVICE."

A semiconductor chip under test is typically divided into separate intellectual property (IP) cores (or custom circuits that constitute a functionally complete unit). The present invention, in one embodiment, can be used to stagger clocks, for example, to all IPs on a chip that share a power rail. Further, the present invention can be used on different types of integrated circuits, e.g., central processing units (CPUs), graphics processing units (GPUs) etc.

Figure 4:
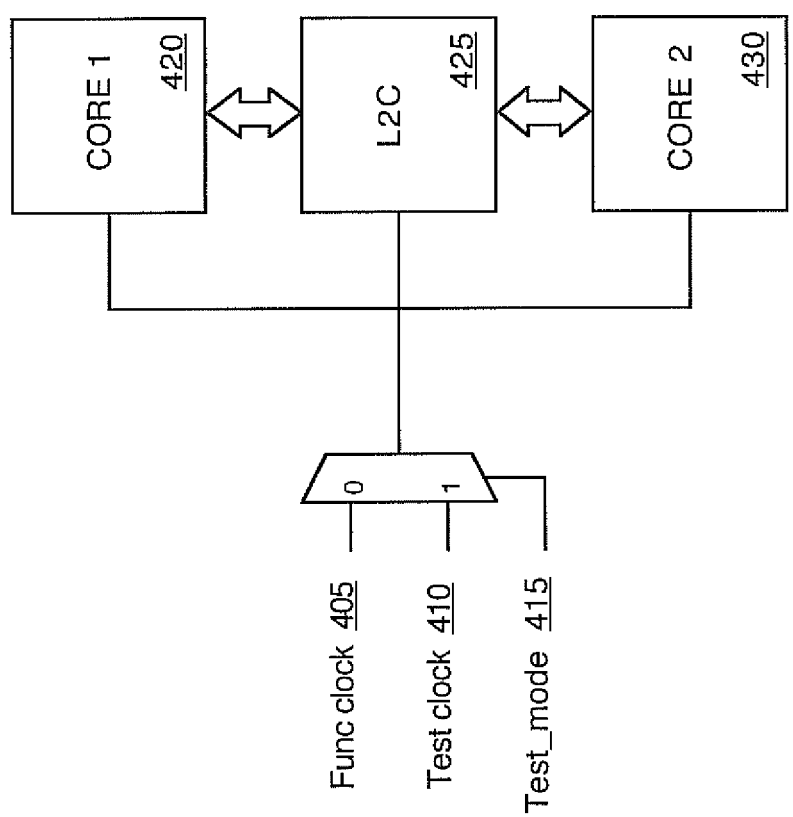
FIG. 4 is a schematic block diagram illustrating an exemplary circuit for multiplexing a test clock with a functional clock in a test processing system in accordance with one embodiment of the present invention.

FIG. 4 is a schematic block diagram illustrating an exemplary circuit for multiplexing a test clock with a functional clock in a processing system, e.g., a CPU or GPU chip being tested using a scan test methodology, in accordance with one embodiment of the present invention. As shown in FIG. 4, test clock 410 may be multiplexed with functional clock 405 at the root of the clock tree for easier timing closure and to conserve routing resources. Both test clock 410 and functional clock 405 are driven externally by ATE through I/O pins coupled to the tester processor 114 in system 110. Signal Test_mode 415 is used to select between the functional clock and the test clock. The selected clock is then routed to exemplary cores Core1 420 and Core2 430 and a cache in the system L2C 425. A separate test clock and functional clock is required for scan based test systems because typically scan shift cycles cannot operate at the same high frequency that the functional cycles operate at.

In one embodiment, the present invention uses the dynamic FTM module for generating clocks for at-speed testing. As explained above, the test clock 410 that is multiplexed to the various IPs in the system during ATPG is of a lower frequency because of the scan shift cycle, which cannot run at application speeds as a result of peak power issues. The capture cycle, however, needs to run at the higher speed of the functional clock for the combinational logic in the clock domain to produce accurate results. Therefore, the dynamic FTM engine is used to dynamically issue multiple at-speed pulses in order to facilitate fast sequential and other at-speed tests such as Logic Built-In Self Test (LBIST).

While less complex conventional systems typically require only a Launch and a Capture pulse during the capture cycle, as illustrated in FIGS. 1 and 2, more complex systems usually require multiple pulses during the capture cycle to get more test coverage. Since the number of capture pulses needed during the capture cycle for more complex systems can vary across full sets of patterns, the number of at-speed pulses that need to be emitted by the tester system to get full coverage cannot be hard-coded. Instead, it needs to be variable and, preferably, programmable.

Figure 5:
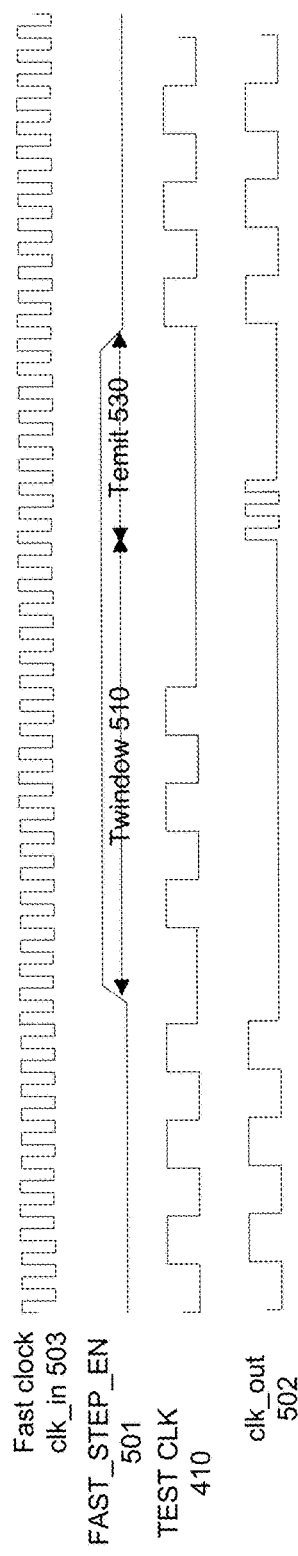
FIG. 5 illustrates a timing diagram for the dynamic fast test mode (FTM) engine in accordance with one embodiment of the present invention

In one embodiment, the number of test clock 410 pulses during a time window, Twindow 510, of the capture cycle are counted by the dynamic FTM engine and the same number of at-speed pulses are emitted during the Temit time window 530 as illustrated in FIG. 5. The duration of the time window to count test clock pulses, however, can be programmed, for example, in a JTAG register by a user. Altering the duration of Twindow will in turn change the number of capture cycles emitted by the FTM engine. Alternatively, in one embodiment, the optimal size for the window to count test clock pulses could be dynamically determined by tester processor 114.

FIG. 5 illustrates a timing diagram for the dynamic fast test mode (FTM) engine in accordance with one embodiment of the present invention. During the scan shift cycle, Scan Enable 101 (as shown in FIG. 1) is asserted and the test clock 102 is toggled to apply the initial state for the scan test. As illustrated in FIG. 5, once shifting is complete, the Scan Enable signal will be deasserted and FAST_STEP_EN 501 will be asserted. FAST_STEP_EN 501 triggers control logic in the FTM engine to select fast clock signal, Fast Clock clk_in 503, instead of TEST CLK 410 for the generation of capture pulses to be routed to the scan chains in the system. The FTM engine receives the fast clock input from a phase locked loop (PLL).

In one embodiment, there are two counters in the FTM engine. One counter keeps track of the number of Fast clock clk_in 503 pulses to determine the duration of Twindow 510, which can be programmable. Another counter keeps track of the number of test clock pulses during Twindow 510. During the Temit window 530 then, the FTM engine will emit the same number of fast clock pulses for scan capture as the number of test clock pulses during the Twindow window. For example, in FIG. 5, the FTM engine emits three fast clock cycles as the clk_out signal 502 after counting three pulses of the TEST CLK 410 signal during Twindow. Following Temit 530, the scan shift cycle will begin and Scan Enable 101 will be asserted to scan out the results of the capture cycle.

It should be noted again that because fast pulses for the capture cycle are emitted during Temit, which starts at the end of Twindow, the point at which the capture pulses are emitted can be controlled by controlling the size of Twindow, which can be programmable through a JTAG register.

Figure 6A:
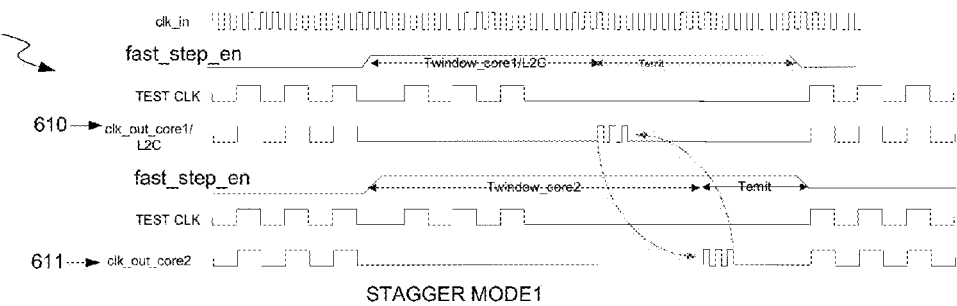
FIG. 6A illustrates a timing diagram for Stagger Mode1 in accordance with one embodiment of the present invention.
Figure 6B:
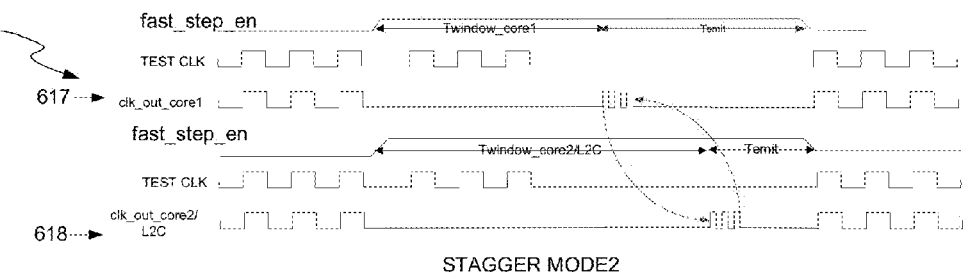
FIG. 6B illustrates a timing diagram for Stagger Mode2 in accordance with one embodiment of the present invention.
Figure 6C:
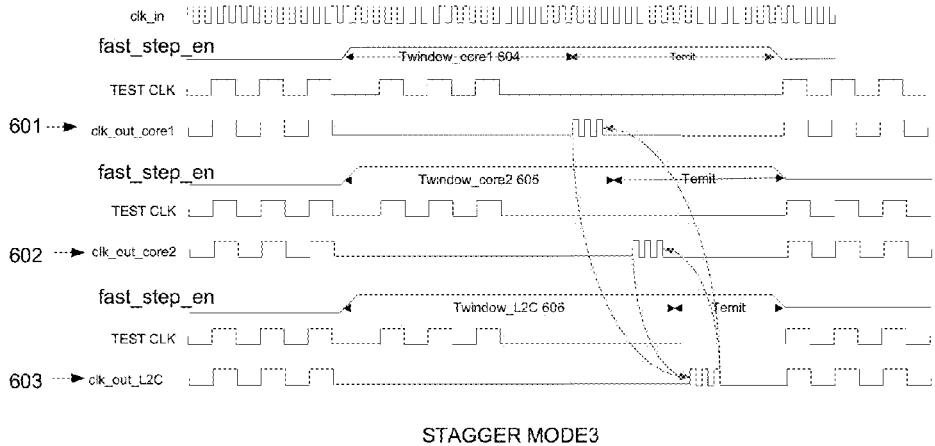
FIG. 6C illustrates a timing diagram for Stagger Mode3 in accordance with one embodiment of the present invention.
Figure 6D:
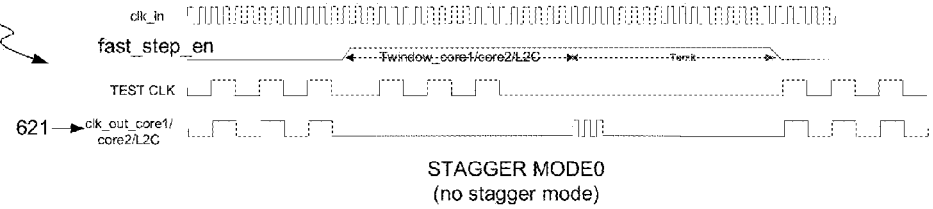
FIG. 6D illustrates a timing diagram for Stagger Mode0 in accordance with one embodiment of the present invention.
Figure 7:
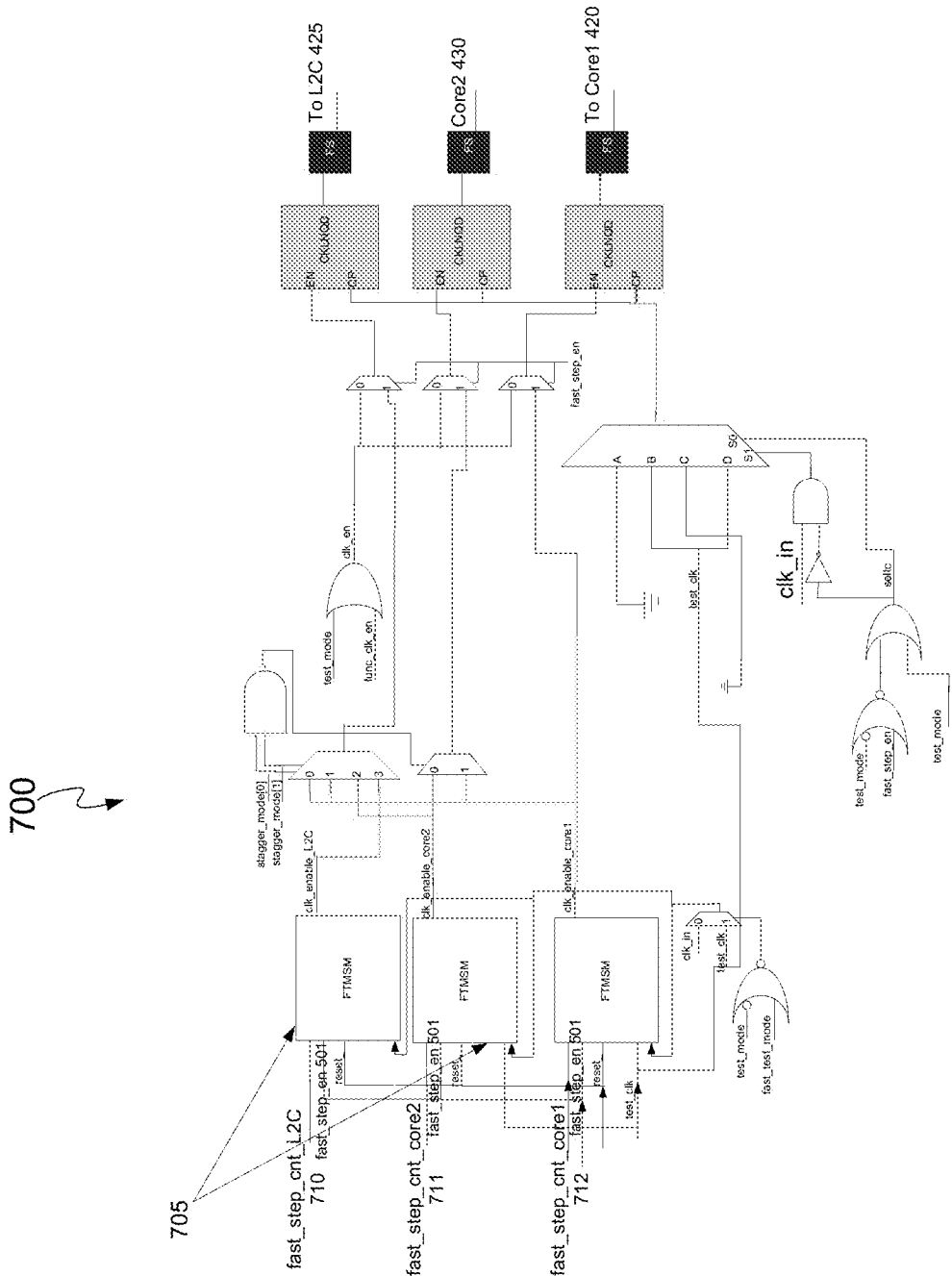
FIG. 7 illustrates an exemplary circuit for implementing capture staggering using dynamic FTM engines in accordance with one embodiment of the present invention.

FIG. 7 illustrates an exemplary circuit for implementing capture staggering using dynamic FTM engines, 705, in accordance with one embodiment of the present invention. The exemplary circuit performs capturing cycle staggering on a system with two cores and an L2C. However, the present invention is not so restricted. In a different embodiment, the circuit can be modified to operate on an integrated circuit (IC) with multiple cores and caches. FIGS. 6A, 6B, 6C, and 6D illustrate exemplary timing diagrams for Stagger Mode1, Stagger Mode2, Stagger Mode3 and Stagger Mode0 respectively, as implemented by the exemplary circuit of FIG. 7, in accordance with one embodiment of the present invention.

In one embodiment, the clock staggering of the present invention is achieved by creating different Twindow and Temit regions for each core and the cache within the integrated circuit. This may be done by programming 3 of the registers in FIG. 7 to different values, namely, fast_step_cnt L2C 710, fast_step_cnt_core2 711 and fast_step_cnt_core1 712. However, the challenge with staggering the clock between the IP cores and cache on an integrated circuit during a capture cycle is that the system needs to account for any paths between the cores and the cache. For example, in FIG. 4, both Core1 420 and Core2 430 share a common path with L2C 425. If the clocks to all three of these modules was staggered, then coverage would be lost for the paths between Core1 and L2C, and Core2 and L2C. Therefore, the path between Core1 and L2C needs to be evaluated in a cycle where both Core1 and L2C are being pulsed together. Similarly, the path between Core2 and L2C needs to be evaluated in a cycle where both Core2 and L2C are being pulsed together.

In a typical system, there may be no paths between the IP cores on a semiconductor chip but there will be paths between the cores and the cache on the chip. However, the principles of the present invention would be similarly applicable to embodiments where there are combinational paths between the various cores as well.

Where all three fast_step_cnt registers, namely, namely, fast_step_cnt L2C 710, fast_step_cnt_core2 711 and fast_step_cnt_core1 712, are programmed with different values, the following three different ATPG runs will be required to minimize coverage loss because of clock stagger.

1. As shown by Stagger Mode 3 in FIG. 6C, capture pulse clocks to Core1, Core2 and L2C, as represented by signal waveforms 601, 602 and 603 respectively, would all be staggered relative to each other. Also, as seen in FIG. 6C, the Twindow durations for each of the cores and L2C modules is different because of the different values programmed in the fast_step_cnt registers. Twindow Core1 604 is the shorter than Twindow Core2 605, which in turn is shorter than Twindow_L2C 606. As a result, the Temit regions for each of the cores and L2C modules starts at different times, thereby, allowing the capture pulses for all three modules to be staggered with respect to each other. Because all the cores and the L2C are being pulsed individually, any paths between the cores and the L2C need to be masked and evaluated in a subsequent ATPG run.

2. As shown by Stagger Mode 1 in FIG. 6A, the paths between Core1 and L2C receives coverage when Core1 and L2C are pulsed together while Core2 is staggered. Paths between Core2 and L2C will be masked during this run. The capture pulses are received by Core1 and L2C at the same time as indicated by signal waveform 610. Capture pulses received by Core2 and indicated by signal waveform 611 are staggered with respect to signal 610.

3. Finally, to receive coverage for paths between Core2 and L2C, Core2 and L2C need to be pulsed together as shown by waveform 618 of Stagger Mode 2 in FIG. 6B. Meanwhile, the Core1 clock will be staggered, as shown by waveform 617, and, accordingly, the paths between Core1 and L2C will be masked in this run.

FIG. 6D simply demonstrates a fallback mode of operation, wherein there is no staggering of clocks. Core1, Core2 and L2C will all get capture pulses at the same time as indicated by waveform 621. This mode is used if clock staggering cannot be implemented or does not need to be implemented in a particular test configuration.

The static capture clock staggering mechanism illustrated in FIGS. 6 and 7 will allow for the staggering of capture clocks to the different cores and L2C of the integrated circuit and mitigate capture power issues. However, as indicated in reference to the example from FIGS. 6 and 7, in order to generate ATPG patterns for these different combinations, separate ATPG runs are required to make to mask paths between staggered regions. This is not efficient in terms of generation and/or verification of patterns in multiple modes.

Figure 8:
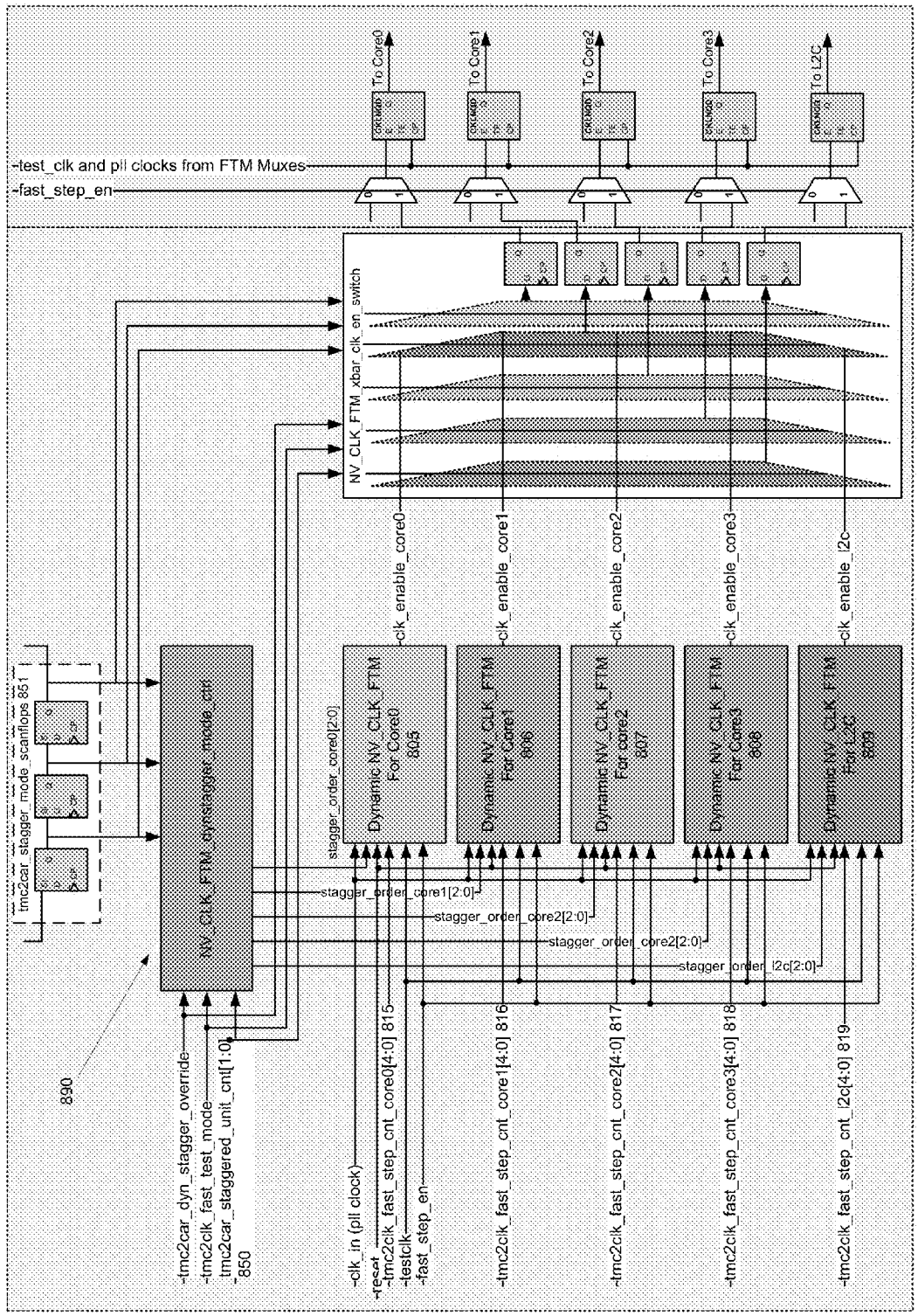
FIG. 8 illustrates an exemplary circuit for implementing dynamic capture clock staggering using dynamic FTM engines in accordance with one embodiment of the present invention.

Accordingly, embodiments of the present invention further provides a dynamic capture clock staggering technique for CPU cores using dynamic FTM engines which would allow for the staggering of capture clocks dynamically and generate ATPG patterns in single. FIG. 8 illustrates an exemplary circuit for implementing dynamic capture clock staggering using dynamic FTM engines for four cores and one L2C in accordance with one embodiment of the present invention. As shown in FIG. 8, each of the modules 805, 806, 807, 808 and 809 is an individual dynamic FTM engine associated with a respective core or L2C.

The staggering for each of the cores or L2C is controlled by the value of its respective tmc2clk_fast_step_cnt_core register (registers 815 through 819) used to program it with the duration of the respective Twindow for each of the modules. In non-dynamic capture clock stagger mode the fast_step_cnt register values programmed in each FTM module determines the staggering between different cores and the L2C. If all FTM modules are programmed to the same fast_step_cnt value, as in FIG. 6D, then all regions are unstaggered, and will pulse capture clock at the same time. If, however, in non-dynamic mode, the fast_step_cnt register values is different, then capture clocks are staggered, but then ATPG pattern needs to be generated as separate runs to ascertain full coverage of all paths.

Dynamic capture clock staggering module NV_CLK_FTM_dynstagger_mode_ctrl 890 comprises the control logic that determines the most optimal combinations and sequence for staggering so that ATPG pattern can be generated in single and coverage for all the paths is obtained in the most efficient way possible. For example, module 890 would be able to evaluate if certain cores do not share a path with the L2C. In such a case, no masking would be required between those cores and the L2C. This way the module 890 prevents the system or user from having to perform separate ATPG pattern runs to ensure coverage for all paths. Or, for example, the tool would be able to determine whether it is more advantageous to pulse Core1 with L2C instead of pulsing Core2 with L2C, based either on the ATPG pattern or because Core2 may share a power rail with L2C and pulsing them together would result in peak power problems.

Based on the ATPG vector, the dynamic capture clock staggering mode will automatically determine and rearrange the combination and sequence of clock staggering operations between the various modules on an integrated circuit. Accordingly, dynamic capture clock staggering allows for complete test coverage with the same execution or invocation of ATPG.

When the dynamic capture clock staggering mode shown in FIG. 8 is enabled, the combination of the number of cores that should be non-staggered with respect to the remaining cores is defined by the tmc2car_staggered_unit_cnt register 850. This value is programmed using a JTAG register to preset specific combination based on power estimation results. Once the specific unit count is enabled using the tmc2car_staggered_unit_cnt register value, then based on the content of tmc2car_stagger_modescanflops 851 at the end of scan shift, different combinations and sequences for staggering can be selected during the capture period by module 890.

Figure 9:
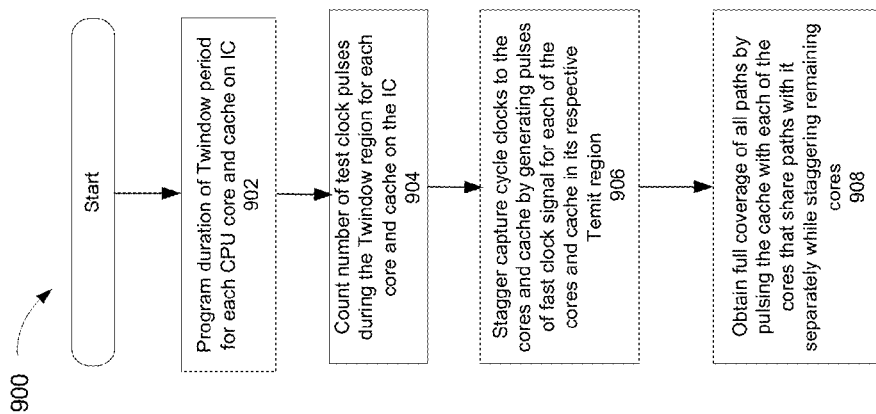
FIG. 9 depicts a flowchart of an exemplary process of mitigating peak power issues during the scan capture cycle at the global level for a scan based test in accordance with one embodiment of the present invention.

FIG. 9 depicts a flowchart of an exemplary process of mitigating peak power issues during the scan capture cycle at the global level for a scan based test in accordance with one embodiment of the present invention. The invention, however, is not limited to the description provided by flowchart 900. Rather, it will be apparent to persons skilled in the relevant art(s) from the teachings provided herein that other functional flows are within the scope and spirit of the present invention. Flowchart 900 will be described with continued reference to exemplary embodiments described above, though the method is not limited to those embodiments.

At step 902, the duration of the Twindow period for each CPU core, e.g., modules 420 and 430, and cache, e.g., module 425, on the IC under test is programmed. In the embodiment of FIG. 7, for example, the 3 registers, fast_step_cnt L2C 710, fast_step_cnt_core2 711 and fast_step_cnt_core1 712, may comprise JTAG bits programmable by a user or may be chosen dynamically by the system based on certain criteria, e.g., LBIST requires up to 16 pulses for capture, so the Twindow period could be chosen by the tester processor 114 within the ATE system taking this factor into account. In one embodiment, each of the three registers can be programmed with a different value so that the capture clock pulses to each of the core and cache modules is staggered.

At step 904, each of the FTM modules 705 for each of the cores and L2C will count the number of test clock pulses within the Twindow region 510 for the respective core and L2C.

At step 906, the FTM engines will emit the same number of fast clock pulses for scan capture as the number of test clock pulses during the Twindow window. For example, in FIG. 5, the FTM engine emits three fast clock cycles as the clk_out signal 502 after counting three pulses of the TEST CLK 410 signal during Twindow. Clock staggering is thus accomplished, because of the varying length of the Twindow region for each of the cores and cache, and the different respective starting points of the Temit region.

At step 908, full coverage is obtained for all the combinational paths by pulsing the cache with each of the cores that share paths with it separately while staggering the remaining cores. In a non-dynamic system, different ATPG runs will need to be scheduled to minimize coverage loss because of clock stagger. For instance, in the embodiment where all the cores and cache are pulsed separately, a different run will need to be scheduled to cover the paths between each of the cores and the L2C cache in separate cycles. A dynamic system, on the other hand, will be able to use a single ATPG vector to dynamically configure the combinations and sequence of pulses between the various cores and cache on the IC to obtain full test coverage.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered as examples because many other architectures can be implemented to achieve the same functionality.

The process parameters and sequence of steps described and/or illustrated herein are given by way of example only. For example, while the steps illustrated and/or described herein may be shown or discussed in a particular order, these steps do not necessarily need to be performed in the order illustrated or discussed. The various example methods described and/or illustrated herein may also omit one or more of the steps described or illustrated herein or include additional steps in addition to those disclosed.

While various embodiments have been described and/or illustrated herein in the context of fully functional computing systems, one or more of these example embodiments may be distributed as a program product in a variety of forms, regardless of the particular type of computer-readable media used to actually carry out the distribution. The embodiments disclosed herein may also be implemented using software modules that perform certain tasks. These software modules may include script, batch, or other executable files that may be stored on a computer-readable storage medium or in a computing system. These software modules may configure a computing system to perform one or more of the example embodiments disclosed herein. One or more of the software modules disclosed herein may be implemented in a cloud computing environment. Cloud computing environments may provide various services and applications via the Internet. These cloud-based services (e.g., software as a service, platform as a service, infrastructure as a service, etc.) may be accessible through a Web browser or other remote interface. Various functions described herein may be provided through a remote desktop environment or any other cloud-based computing environment.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

Embodiments according to the invention are thus described. While the present disclosure has been described in particular embodiments, it should be appreciated that the invention should not be construed as limited by such embodiments, but rather construed according to the below claims.

What is claimed is:

1. A method for testing an integrated circuit, said method comprising:
    programming a respective duration of a first time window for each of a plurality of modules on the integrated circuit;
    counting a number of pulses of a first clock signal during the first time window for each of the plurality of modules; and
    staggering capture pulses to the plurality of modules by generating pulses of a second clock signal for each of the plurality of modules during a respective second time window, wherein a number of pulses generated is based on a respective number of first clock signal pulses counted for each of the plurality of modules.

2. The method of claim 1, wherein the modules comprise a plurality of processing cores and a cache.

3. The method of claim 1, further comprising pulsing each of the plurality of cores with the cache while staggering remaining cores in separate ATPG runs to obtain coverage for combinational paths between a respective core and the cache.

4. The method of claim 3, further comprising masking paths between the cache and the remaining cores.

5. The method of claim 1, further comprising dynamically obtaining coverage for substantially all combinational paths on the integrated circuit during a single ATPG run by pulsing a first subset of the plurality of modules together while staggering remaining modules.

6. The method of claim 5, wherein modules to be included in the first subset are dynamically determined, and wherein the modules can be comprised of cores and a cache.

7. The method of claim 6, wherein combinational paths between the modules in the first subset and the remaining modules is masked when the cores and the cache in the first subset are pulsed together.

8. The method of claim 1 wherein the integrated circuit is selected from the group comprising: a graphics processor and a central processor.

9. The method of claim 1 wherein the respective duration of the first time window is programmable by a user.

10. A method for testing an integrated circuit, said method comprising:
    programming a respective duration of a first time window for each of a plurality of modules on the integrated circuit;
    counting a number of pulses of a first clock signal during the first time window for each of the plurality of modules; and
    dynamically staggering capture pulses to a first subset of modules by generating pulses of a second clock signal for each of the plurality of modules during a respective second time window, wherein a number of pulses generated is based on the respective number of first clock signal pulses counted for each of the plurality of modules.

11. The method of claim 10, wherein the modules comprise a plurality of processing cores and a cache.

12. The method of claim 10 wherein a second subset of modules receives the pulses of the second clock signal simultaneously, wherein the second subset of modules comprises modules not included in the first subset.

13. The method of claim 10 wherein a value of a number of modules in the second subset is programmable.

14. A system for testing an integrated circuit, said system comprising:
- a computer system comprising a tester processor, wherein said tester processor is communicatively coupled to a integrated circuit, wherein said integrated circuit comprises:
- a plurality of modules;
- an I/O port operable to program a respective duration of a first time window for each of the plurality of modules on the integrated circuit; and
- a plurality of fast clock generating modules configured to:
  - count a number of pulses of a first clock signal during the first time window for each of the plurality of modules; and
  - stagger capture pulses to the plurality of modules by generating pulses of a second clock signal for each of the plurality of modules during a respective second time window, wherein a number of pulses generated is based on a respective number of first clock signal pulses counted for each of the plurality of modules.

15. The system of claim 14, wherein the modules comprise a plurality of processing cores and a cache.

16. The system of claim 15, wherein the plurality of fast clock generating modules are further configured to pulse each of the plurality of cores with the cache while staggering remaining cores during separate ATPG runs to obtain coverage for combinational paths between a respective core and the cache.

17. The system of claim 16, wherein the plurality of fast clock generating modules are further configured to mask paths between the cache and the remaining cores.

18. The system of claim 15, further comprising a dynamic capture clock staggering module configured to dynamically obtain coverage for substantially all combinational paths on the integrated circuit during a single ATPG run by pulsing a first subset of the plurality of cores and cache together while staggering remaining cores.

19. The system of claim 15, wherein a number of capture pulses generated can be changed by altering the respective duration of the first time window for each of the plurality of cores and the cache.

20. The system of claim 14, wherein the I/O port is a JTAG port operable to be programmed by a user.

* * * * *